US005956560A

United States Patent [19]
Dorfman et al.

[11] Patent Number: 5,956,560
[45] Date of Patent: Sep. 21, 1999

[54] TUNGSTEN-COPPER COMPOSITE POWDER

[75] Inventors: Leonid P. Dorfman, Athens; David L. Houck, Towanda; Michael J. Scheithauer, Ulster, all of Pa.; Muktesh Paliwal, Owego, N.Y.; Gail T. Meyers, Leraysville; Frank J. Venskytis, Monroeton, both of Pa.

[73] Assignee: Osram Sylvania Inc., Danvers, Mass.

[21] Appl. No.: 08/784,159

[22] Filed: Jan. 15, 1997

Related U.S. Application Data

[60] Division of application No. 08/559,903, Nov. 17, 1995, which is a continuation-in-part of application No. 08/362,024, Dec. 22, 1994, Pat. No. 5,468,457, and application No. 08/361,415, Dec. 22, 1994, Pat. No. 5,470,549.

[51] Int. Cl.$^6$ ...................................................... B22F 1/80
[52] U.S. Cl. ............................................... 419/38; 419/47
[58] Field of Search ........................... 419/38, 47; 75/248

[56] References Cited

U.S. PATENT DOCUMENTS

| | | | |
|---|---|---|---|
| 3,382,066 | 5/1968 | Kenney et al. | 75/208 |
| 3,418,103 | 12/1968 | Lasdon . | |
| 3,576,619 | 4/1971 | Emtey . | |
| 4,498,395 | 2/1985 | Kock et al. | 102/517 |
| 4,913,731 | 4/1990 | Kopatz et al. | 75/346 |
| 5,049,184 | 9/1991 | Harner et al. | 75/246 |
| 5,439,638 | 8/1995 | Houck et al. | 419/30 |
| 5,467,457 | 11/1995 | Dorfman et al. | 423/61 |
| 5,470,549 | 11/1995 | Dorfman et al. | 423/61 |

FOREIGN PATENT DOCUMENTS

| | | | |
|---|---|---|---|
| 4-371373 | 2/1992 | Japan | B23K 11/30 |

OTHER PUBLICATIONS

Abstract, Lee et al., Microhomogeneity and Sintering of Tungsten–Copper Composite Powders Produced by Hydrogen Reduction, Diffus. Defect Data, Pt. B (1992).

Abstract, Johnson et al., Effect of Processing Variables on the Properites of Liquid Phase Sintered Tungsten–Copper Composites, Adv. Powder Metall. (1991), 391–405.

Abstract, Tungsten–based Powder Metallurgy Alloys with Improved Density Stability—Obtd. by Sintering Reduced Tungsten and Copper Oxide(s) at Specified Temperature, Patent No. RU2003436 (1993).

V.V. Skorokhod et al., Sintering of Tungsten–Copper Composites of Various Origins, Poroshkovaya Metallurgiya, No. 9(249), pp. 9–13 (1983).

A.K. Basu et al., Copper–Tungsten Composite Powders by the Hydrogen Reduction of Copper Tungstate, J.Mater.Sci., 13, 2703–2711 (1978).

V.V. Skorokhod et al., Reaction in the Cu–W–O System, Neorganicheskie Materialy, v. 20, n. 3, 458–460 (1984).

Q. Chongliang et al., A Study on Fine Grain W–Cu Electrode Material with High Homogeneity, Proceedings of the 13th International Plansee Seminar, Metallwerk Plansee, v. 1, 461–470 (1993).

V.I. Kornilova et al., Effect of Oxygen on the Liquid–Phase Sintering of Very Fine Tungsten–Copper Powder Mixtures, Poroshkovaya Metallurgiya, n. 3(267), 24–26 (1985).

J.L. Johnson et al., Phase Equilibria Effects on the Enhanced Liquid Phase Sintering of Tungsten–Copper, Metallurgical Transactions A, v. 24A 2369–2377 (1993).

J.S. Lee et al., Microstructural Changes in W–Cu and W–Cu–Ni Compacts During Heating Up for Liquid Phase Sintering, Modern Developments in Powder Metallurgy, 15, 489–506 (1985).

J.S. Lee et al., Enhanced Sintering of Microhomogenous W–Cu Composite Powders, Proceedings of Powder Metallurgy World Congress, Japan Society of Powder and Powder Metallurgy, 365–368 (1993).

N.C. Angastiniotis et al., Formation and Alloying of Nanostructured β–W Powders, Nanostructured Materials, v. 1 293–302 (1992).

B. Yang et al., A Study on Controlling the Thermal Conductivity and Sintering Properties of W–Cu Composites, P/M$^2$ TEC' 93 Conference (May 16–19, 1993).

L.N. Paritskaya, Diffusional Homogenization in Objects from Ultrafine Powders (Review), Poroshkovaya Metallurgiya, n. 6(258), 28–39 (1984).

V.N. Troitskii et al., Initial Sintering Temperature of Ultrafine Metal Powders, Poroshkovaya Metallurgiya, n. 1(241), 13–15 (1983).

V.V. Skorokhod et al., Solid–Phase Sintering of Ultrafine W(Mo)–Cu Composite Powders, Poroshkovaya Metallurgiya, n. 1(253) 19–25 (1984).

V.N. Eremenko et al., Study of Consolidation Processes in Sintering in the Presence of a Liquid Phase, Poroshkovaya Metallurgiya, n. 4(10), 72–83 (1962).

V.V. Skorokhod et al., Structural Inhomogeneity and Localization of Densification in the Liquid–phase Sintering of Tungsten–Copper Powder Mixtures, Poroshkovaya Metallurgiya, n. 8(284), 14–19 (1986).

V.V. Panichkina et al., Liquid–Phase Sintering of Very Fine Tungsten–Copper Powder Mixtures, Poroshkovaya Metallurgiya, n. 6(234), 27–31 (1982).

A.V. Choba et al., Calculation of the Thermophysical Properties of Tunsgten–Copper Pseudoalloys, Poroshkovaya Metallurgiya, n. 8(248), 50–55 (1983).

V.A. Dymchenko, Sintering of Copper–Tungsten Materials, Poroshkovaya Metallurgiya, n. 5(269), 27–29 (1985).

(List continued on next page.)

*Primary Examiner*—Ngoclan Mai
*Attorney, Agent, or Firm*—Robert F. Clark

[57] ABSTRACT

A high performance W—Cu composite powder which is composed of individual particles having a tungsten phase and a copper phase wherein the tungsten phase substantially encapsulates the copper phase. The tungsten-coated copper composite powder may be pressed and sintered into W—Cu pseudoalloy articles having a homogeneous distribution of W and Cu phases without experiencing copper bleedout or it may be used in ceramic metallization for the electronics industry.

9 Claims, 7 Drawing Sheets

OTHER PUBLICATIONS

K.V. Sebastian et al., Densification in W–Cu Sintered Alloys Produced from Coreduced Powders, Planseeberichte fur Pulvermetallurgie, Bd. 25, 84–99 (1977).

A.K. Basu and F.R. Sale, The Controlled Reduction of Copper Tungstate in $H_2O/H_2$ Mixtures, J.Mater.Sci, 14, 91–99 (1979).

B. Yang et al., The Effects of Tungsten Particle Size and Powder Treating Techniques on the Sintered Properties of W–15Cu, Adv. Powder Metall. Part. Mater., v. 2, 203–16 (1993).

(Abstract) Wu et al., Study on Formation and H2 Reduction of Copper Tungstate, Zhongnan Kuangye Xueyuan Xuebao, 24(1), 64–8 (1993).

TUNGSTEN-COPPER COMPOSITE POWDER

CROSS-REFERENCE TO RELATED APPLICATIONS

This application is a division of application Ser. No. 08/559,903, filed on Nov. 17, 1995, which is a continuation-in-part of application Ser. No. 08/362,024 now U.S. Pat. No. 5,468,457 and Ser. No. 08/361,415 now U.S. Pat. No. 5,470,549, both filed Dec. 22, 1994, the disclosures of which are incorporated herein by reference.

BACKGROUND ART

Tungsten-copper (W—Cu) pseudoalloys are used in the manufacture of electrical contact materials and electrodes, thermal management devices such as heat sinks and spreaders, and conductive inks and pastes for ceramic metallization. The basic methods for the fabrication of articles composed of W—Cu pseudoalloys include: infiltration of a porous tungsten skeleton with liquid copper, hot pressing of blends of tungsten and copper powders, and various techniques incorporating liquid phase sintering, repressing, explosive pressing, and the like. Complex shapes may be made by injection molding W—Cu composite powders. It is desirable to be able to manufacture articles made from W—Cu pseudoalloys at or near the theoretical density of the pseudoalloy. Besides having improved mechanical properties, the higher density pseudoalloys have higher thermal conductivities which are critical for the application of W—Cu pseudoalloys as heat sink materials for the electronics industry.

The components in the W—Cu system exhibit only a very small intersolubility. Thus, the integral densification of W—Cu pseudoalloys occurs above 1083° C. in the presence of liquid copper. The compressive capillary pressure generated by the forming and spreading of liquid copper, the lubrication of tungsten particles by liquid copper and the minute solubility of tungsten in copper above 1200° C. combine to cause the relative movement of tungsten particles during sintering and thereby make possible the displacement of tungsten particles. Local densification and rearrangement of the tungsten framework causes an inhomogenous distribution of W and Cu phases in the sintered article and copper bleedout, i.e. the loss of copper from the sintered article. This leads to the degradation of the thermal/mechanical properties of the sintered article.

Prior art methods directed to improving the homogeneity of W—Cu composite powders by coating tungsten particles with copper have not been successful as these copper-coated powders still exhibit a high tendency towards copper bleedout during the consolidation of the composite powder into fabricated shapes.

Thus, it would be advantageous to eliminate copper bleedout from occurring during the liquid-phase sintering of W—Cu pseudoalloys while providing a homogeneous distribution of W and Cu phases in the sintered article.

SUMMARY OF THE INVENTION

It is an object of the invention to obviate the disadvantages of the prior art.

It is another object of the invention to produce a W—Cu composite powder which can be used to make W—Cu pseudoalloys having high electrical and thermal conductivities.

It is a further object of the invention to produce a W—Cu composite powder which may be pressed and sintered to near theoretical density without copper bleedout.

It is still a further object of the invention to produce a W—Cu composite powder which may be used to make sintered articles having a high degree of dimensional control.

In accordance with one object the of invention, there is provided a tungsten-copper composite powder comprising individual particles having a tungsten phase and a copper phase wherein the tungsten phase substantially encapsulates the copper phase.

In accordance with another object of the invention, there is provided a W—Cu composite oxide powder comprising individual particles having a copper tungstate phase and tungsten trioxide phase wherein the tungsten trioxide phase exists primarily at the surface of the individual particles.

In accordance with a further object of the invention, there is provided a method for forming a homogeneous W—Cu pseudoalloy comprising pressing a tungsten-coated copper composite powder to form a compact and sintering the compact.

In accordance with a still further object of the invention, there is provided a W—Cu pseudoalloy having a microstructural cross-section having tungsten areas and copper areas, the tungsten areas being less than about 5 $\mu$m in size and the copper areas being less than about 10 $\mu$m in size.

DESCRIPTION OF THE PREFERRED EMBODIMENTS

Figure 1:
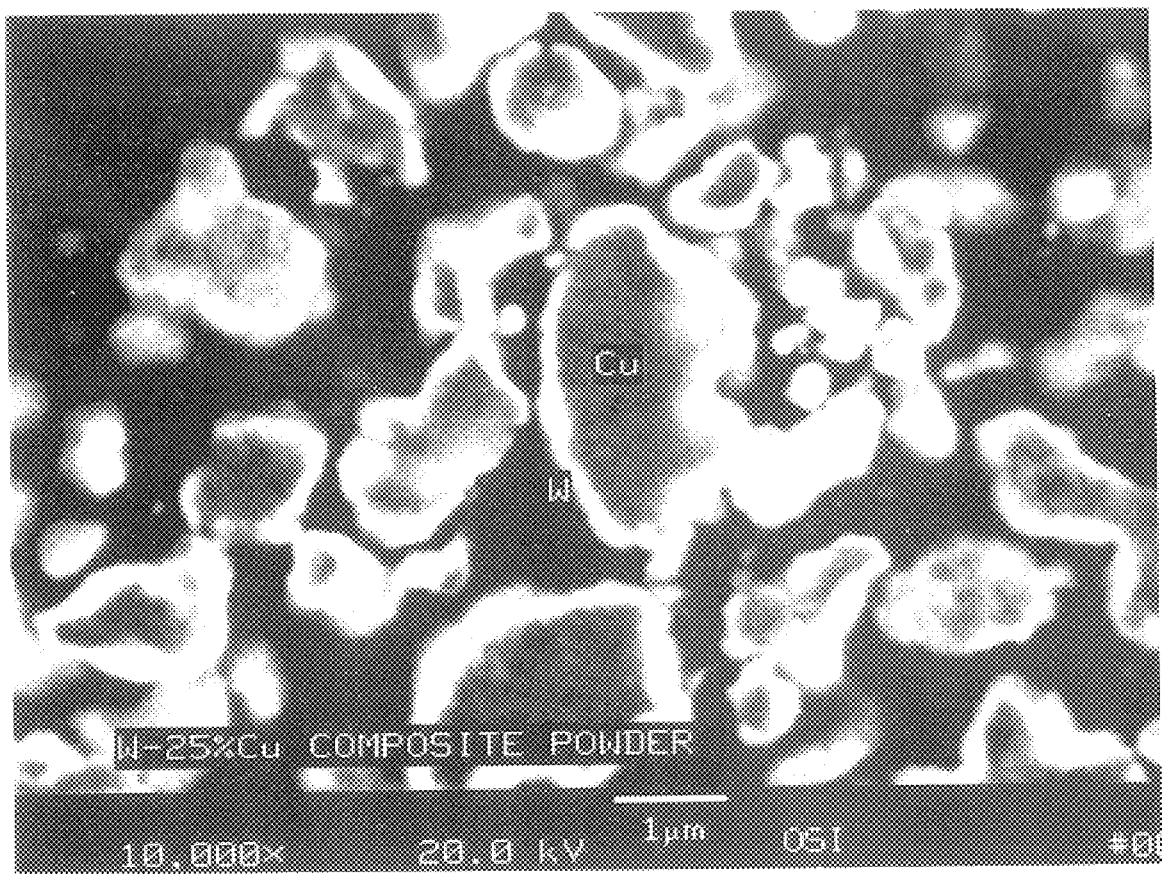
FIG. 1 is a photomicrograph of a cross-section of a tungsten-coated copper composite powder containing 25 weight percent copper.

For a better understanding of the present invention, together with other and further objects, advantages and capabilities thereof, reference is made to the following disclosure and appended claims taken in conjunction with the above-described drawings.

Several factors influence the solid-state (below 1083° C.—the melting point of copper) and liquid-phase (above the melting point of copper) sintering behavior of submicron W—Cu powder systems. Compacted refractory metal powders undergo considerable microstructural changes and shrinkage during solid-state sintering (in the absence of liquid phase). Submicron particle size powders effectively recrystallize and sinter at temperatures (T) which are much lower than the melting temperatures ($T_m$) of refractory metals (T≅0.3 $T_m$) The initial sintering temperature for submicron (0.09–0.16 $\mu$m) tungsten powder is in the range of 900–1000° C. The spreading of copper and the formation of a monolayer copper coating on tungsten particles occurs in the temperature range of 1000–1083° C. By lowering the activation energy for tungsten diffusion, monolayer copper coatings activate the solid-state sintering of tungsten. Therefore, a number of complementary conditions are met for bonding submicron tungsten particles into a rigid tungsten framework within the composite powder compact during solid-state sintering (950–1080° C.). High fineness and homogeneity of the starting composite powders are expected to enhance the sintering of a structurally homogeneous tungsten framework. Such framework should, in turn, aid in making a homogeneous pseudoalloy.

Such an idealized mechanism is complicated by local densification. Due to nonuniform distribution of stresses at compaction of the starting powder, submicron tungsten particles may experience rapid densification in local regions. An unevenly sintered tungsten framework will cause structural inhomogeneity, localization of integral densification, and copper bleedout at the liquid-phase sintering stage. Liquid-phase sintering comprises three stages: particle rearrangement, grain growth by a dissolution-reprecipitation mechanism, and the formation and densification of a rigid skeleton. The operating mechanism for integral densification in W—Cu systems consists of particle rearrangement with the rate of densification inversely proportional to particle size and grain shape accommodation for solid particles aided by minute solubility of tungsten in copper at 1200° C. and above.

Integral densification of W—Cu pseudoalloys strongly depends on capillary pressure generated by the liquid copper. This pressure increases with the reduction of the liquid phase wetting angle. The wettability of tungsten by copper improves with temperature. At 1100° C. the wetting angle is already substantially below 90°, and it steadily diminishes with temperature to a value close to zero at 1350° C. With improvement of the wettability, the dihedral angles between adjacent tungsten particles attain values necessary for the liquid to penetrate the space between the particles and force them to slide relative to each other. The rate and extent of integral densification and rearrangement of the tungsten framework are also affected by the amount of liquid phase and the size of tungsten particles.

We have discovered that a homogeneous sintered W—Cu pseudoalloy article can be formed without copper bleedout by using a W—Cu composite powder composed of tungsten-coated copper composite particles. Because the individual particles have a tungsten outer layer and a copper core, W—W contacts dominate during compaction of the composite powder. This results in forming a network of interconnected submicron tungsten particles within the powder compact immediately after powder consolidation. Solid-state sintering of the powder compact results in a structurally homogeneous tungsten framework which enables uniform internal infiltration of the framework with copper during liquid-phase sintering and the formation of a dense pseudoalloy with a continuous tungsten/copper structure. As used herein, the term "tungsten-coated" or "W-coated" means that the tungsten phase substantially encapsulates the copper phase. Unless otherwise indicated, all of the W—Cu composite powders discussed below are composed of tungsten-coated copper particles.

The preferred W—Cu composite powder has a Fisher Sub-Sieve Sizer (FSSS) particle size range of about 0.5 $\mu$m to about 2.0 $\mu$m in the copper content range of 2 to 25 wt. %. Each composite particle has a tungsten coating whose average thickness varies with the size and shape of the particle and ranges between about 0.1 to about 0.2 $\mu$m.

Figure 2:
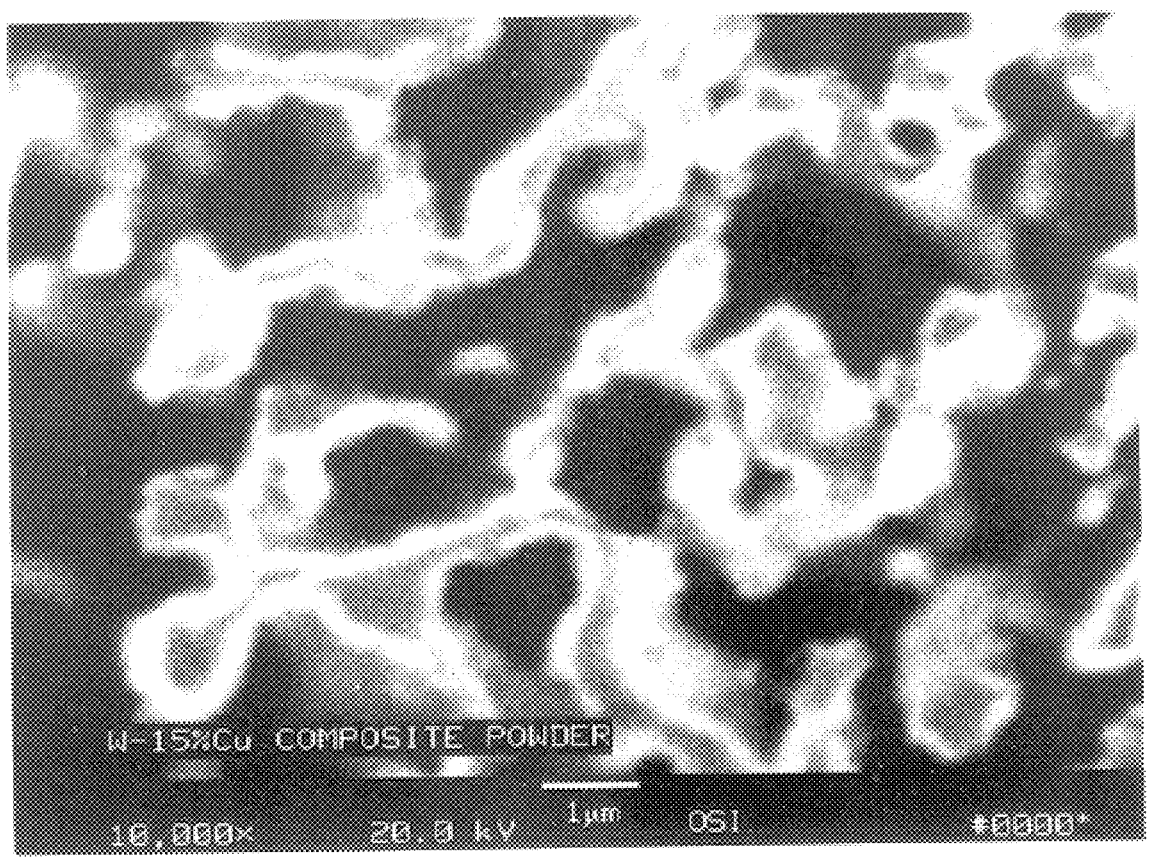
FIG. 2 is a photomicrograph of a cross-section of a tungsten-coated copper composite powder containing 15 weight percent copper.
Figure 3:
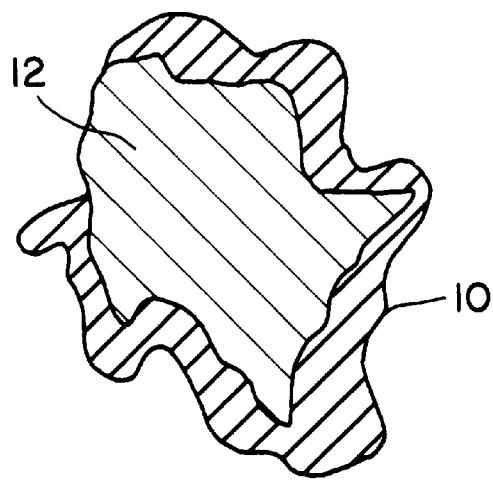
FIG. 3 is an illustrative view of a cross-section of a tungsten-coated copper composite particle wherein the tungsten phase substantially encapsulates the copper phase.
Figure 4:
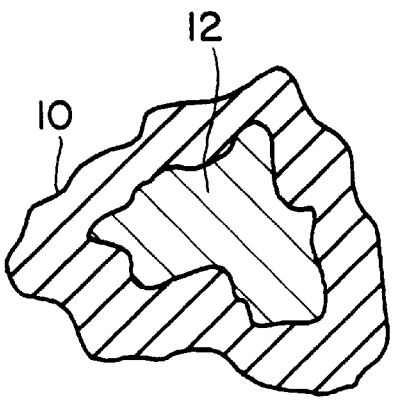
FIG. 4 is an illustrative view of a cross-section of a tungsten-coated copper composite particle wherein the tungsten phase completely encapsulates the copper phase.
Figure 5:
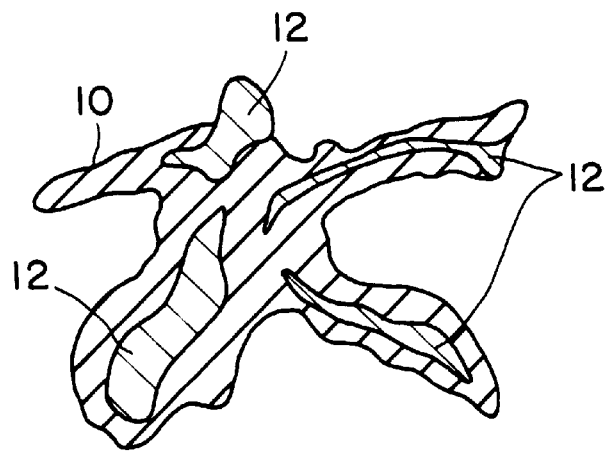
FIG. 5 is an illustrative view of a cross-section of a tungsten-coated copper composite particle having a dendritic morphology wherein the tungsten phase substantially encapsulates the copper phase.

FIGS. 1 and 2 are Back-scattered Electron Images (BEI) of cross-sections of tungsten-coated copper powders containing 25 and 15 wt. % copper, respectively. The BEI photomicrographs clearly show that the tungsten phase which appears as white has substantially encapsulated the copper phase which appears as gray. The black areas between the particles are from the epoxy mounting material. FIGS. 3, 4, and 5 are illustrations of cross-sections of individual tungsten-coated copper composite particles. FIG. 3 shows the tungsten phase 10 substantially encapsulating the copper phase 12. FIG. 4 shows a particle where the W phase 10 has completely encapsulated the Cu phase 12. FIG. 5 shows a particle having a dendritic morphology wherein the W phase 10 has substantially encapsulated the Cu phase 12. At least 50% of the surface of the Cu phase is encapsulated by the W phase. Preferably, the tungsten-coated copper composite particles have at least 70% of the surface of the copper phase encapsulated by the W phase. More preferably, at least 90% of the surface of the Cu phase is encapsulated by the W phase.

A preferred method for forming the tungsten-coated copper composite particles involves the hydrogen reduction of a W—Cu composite oxide powder containing $CuWO_4$ and $WO_3$. Such a composite oxide may be made by reacting an ammonium tungstate, such as ammonium paratungstate (APT) or ammonium metatungstate (AMT), with an oxide or hydroxide of copper. Methods for forming W—Cu composite oxides are described in copending patent application Ser. Nos. 08/362,024 and 08/361,415, both filed Dec. 22, 1994, the disclosures of which are incorporated herein by reference.

In order to form an excess of $WO_3$ in the composite oxide, the amount of ammonium tungstate used is greater than the stoichiometric amount which would be required to form copper tungstate ($CuWO_4$). Such a reaction forms an intimate mixture of $CuWO_4$ and $WO_3$ phases having a relative copper content less than about 25 percent, i.e. relative to tungsten ($CuWO_4$ has a relative copper content of 25.7%). A homogeneous W—Cu composite oxide powder having a composition of $CuWO_4+(0.035–15)\ WO_3$ and a relative copper content of about 25% to about 2% is the preferred material to make the tungsten-coated copper composite powder. Examples of the synthesis of W—Cu composite oxides having variable copper content are given in Table 1.

TABLE 1

| Reaction | Relative Copper Content in W-Cu Composite Oxide |
|---|---|
| 0.547 AMT + 0.5 Cu$_2$O + 0.25 O$_2$ → CuWO$_4$ + 5.566 WO$_3$ | 5.0% |
| 0.259 AMT + 0.5 Cu$_2$O + 0.25 O$_2$ → CuWO$_4$ + 2.11 WO$_3$ | 10.0% |
| 0.163 AMT + 0.5 Cu$_2$O + 0.25 O$_2$ → CuWO$_4$ + 0.958 WO$_3$ | 15.0% |
| 0.115 AMT + 0.5 Cu$_2$O + 0.25 O$_2$ → CuWO$_4$ + 0.382 WO$_3$ | 20.0% |
| 0.083 AMT + 0.5 Cu$_2$O + 0.25 O$_2$ → CuWO$_4$ | 25.7% |

It is believed that the encapsulation of the copper phase by the tungsten phase starts at the composite oxide synthesis stage with the formation of a WO$_3$-coated CuWO$_4$ core within every discrete particle of the W—Cu composite oxide powder. It has been observed that reactions of ammonium tungstates with oxides of copper produce composite oxide powders having particle morphologies which mimic the morphology of the ammonium tunsgtate particles. This is similar to the effect observed in the production of tungsten powder by hydrogen reduction of WO$_3$. There, the morphology of the tungsten powder is controlled by the morphology of the WO$_3$ which, in turn, is strongly influenced by the morphology of the ammonium tungstate powders from which the WO$_3$ is made.

I. W—Cu COMPOSITE OXIDE PRECURSOR

W—Cu composite oxide powders having a composition of CuWO$_4$+0.958 WO$_3$ were synthesized from (1) Cu$_2$O+ precipitated APT (angular particle morphology) and (2) Cu$_2$O+spray-dried AMT (spherical particle morphology). Both APT and AMT powders were converted to composite oxide particle agglomerates which were isomorphic with the starting particles of APT and AMT. The particles of cuprous oxide totally disappeared during synthesis of the composite oxide. It was not possible to identify any effect of the starting morphology of Cu$_2$O on the morphology of the composite oxide powder. The small, mostly submicron, grains forming each particle of the W—Cu composite oxide suggest that WO$_3$ grains outline the diffusion boundaries for the solid-phase reaction. It is believed that the reaction mechanism consists of the diffusion of mobile molecules of copper oxide into WO$_3$ grains. The ability to control the W—Cu composite oxide morphology by varying the morphology of ammonium tungstates used in synthesis can be used to influence the kinetics of the hydrogen reduction of the oxides and the morphology of co-reduced W—Cu composite powders.

W—Cu composite oxides having a composition of CuWO$_4$+nWO$_3$ (n=0.035–15) and a relative copper content in the range of 25 to 2% have been synthesized from Cu$_2$O and spray-dried AMT. A number of these composite oxides and stoichiometric copper tungstate formed by the same method (25.7 to 5% Cu, n=0–5.566) were subjected to elemental analysis by Energy Dispersive X-ray Spectroscopy (EDS) and to phase analysis by X-Ray Diffraction (XRD). The EDS analysis included measurement of W—Lα to Cu—Kα peak intensity ratios from which W/Cu atomic ratios for the different oxide compositions were calculated for single particles per field and groups of 2 to 5 particles of different sizes per field. The analytical results for populations of single particles are given in Table 2. A good correlation between experimental and theoretical W/Cu atomic ratios were found for all analyzed particle sizes of the stoichiometric CuWO$_4$ (n=0) composite oxide. However, for the single-size particle populations corresponding to the CuWO$_4$+nWO$_3$ (n=0.382–5.566) composite oxides, the experimental W/Cu atomic ratio deviated significantly from the theoretical W/Cu atomic ratio. Table 2 shows that the size of the deviation grows with increasing WO$_3$ content and is especially pronounced for 1 μm particles. Tungsten, copper, and oxygen peaks were present in every analyzed particle which confirmed that the particles formed in the course of solid-phase synthesis are W—Cu composite oxides as opposed to mechanical mixtures of CuWO$_4$ and WO$_3$.

TABLE 2

| | Theoretical Data | | Experimental Average W/Cu | | | |
|---|---|---|---|---|---|---|
| Oxide | Relative Copper | W/Cu Atomic | Atomic Ratio for Populations With a Particle Size of, μm | | | |
| Composition | Content, % | Ratio | 1 | 5 | 15 | 30 |
| CuWO$_4$ | 25.7 | 1.000 | 0.963 | 0.957 | 0.956 | 0.949 |
| CuWO$_4$ + 0.382 WO$_3$ | 20 | 1.382 | 1.553 | 1.476 | 1.977 | 1.502 |
| CuWO$_4$ + 0.958 WO$_3$ | 15 | 1.958 | 3.649 | 2.629 | 3.351 | 3.042 |
| CuWO$_4$ + 2.11 WO$_3$ | 10 | 3.110 | 13.909 | 7.203 | 7.677 | 3.672 |
| CuWO$_4$ + 5.566 WO$_3$ | 5 | 6.566 | 22.338 | 9.779 | 8.538 | 10.738 |

A better correlation between theoretical and experimental W/Cu atomic ratios is found when 2 to 5 particles of different sizes are analyzed. Thus, there is an improvement in material homogeneity with an increase in the number of analyzed particles. The homogeneity of populations of particles can be expressed as a coefficient of variation which is defined as the ratio of the population standard deviation to its mean expressed in percent. Table 3 gives the coefficients of W/Cu atomic ratio variation for populations of single 1 μm particles (Column A) and populations of 2 to 5 particles of different sizes (Column B).

TABLE 3

| W-Cu Composite Oxide Composition | A | B |
|---|---|---|
| CuWO$_4$ | 3.0 | 4.9 |
| CuWO$_4$ + 0.382 WO$_3$ | 122.9 | 12.3 |
| CuWO$_4$ + 0.958 WO$_3$ | 141.4 | 43.2 |
| CuWO$_4$ + 2.11 WO$_3$ | 82.6 | 30.9 |
| CuWO$_4$ + 5.566 WO$_3$ | 29.9 | 17.0 |

The deviation from CuWO$_4$ stoichiometry results in a reduction of the W—Cu composite oxide homogeneity for particle sizes of about 1 μm (Column A). Homogeneity for the single 1 μm particles improves with increasing amounts of $WO_3$. The effect is less pronounced when larger particles or larger number of particles are analyzed (Column B). The variations in homogeneity disappear entirely when thousands of particles are examined simultaneously as with Sputtered Neutral Mass Spectrometry (SNMS) analysis.

Figure 6:
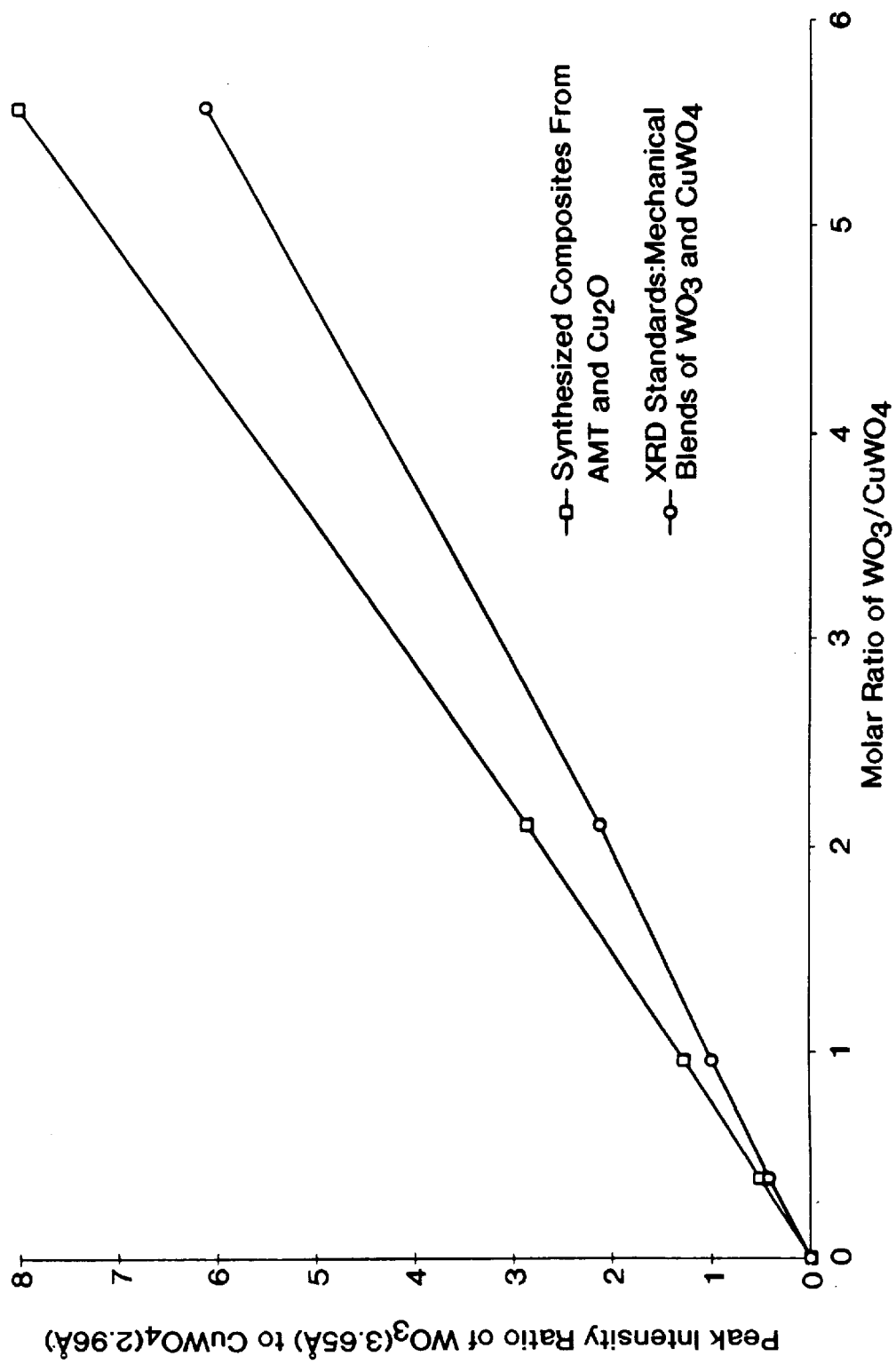
FIG. 6 is a graphical illustration of the relationship between the molar ratio of tungsten trioxide to copper tungstate and the X-ray Diffraction peak intensity ratio of tungsten trioxide (3.65 Å) to copper tungstate (2.96 Å) for synthesized W—Cu composite oxides and mechanical mixtures of copper tungstate and tungsten trioxide.

XRD phase analysis of synthesized composites were compared to XRD standards made of mechanical blends of $CuWO_4$ and $WO_3$ powders containing the same proportions of the two phases. FIG. 6 shows that the $WO_3/CuWO_4$ peak intensity ratio is consistently greater for the synthesized $CuWO_4+nWO_3$ (n=0.382–5.566) composite oxides compared to the corresponding mechanical blends.

The EDS and XRD results for the $CuWO_4+nWO_3$ (n=0.382–5.566) composite oxides indicate that fine submicron $CuWO_4$ particles are being surrounded by $WO_3$ particles within 1 μm particle agglomerates. It is believed that this encapsulation of the $CuWO_4$ phase by the $WO_3$ phase results in the formation of finely dispersed tungsten-coated copper particles during hydrogen reduction of the composite oxide.

Forming the W—Cu composite oxides from ammonium tungstates and oxides or hydroxides of copper yields additional benefits. The high surface areas and additional reactivity generated from the thermal decomposition of these reactants improves the degree of mixing, shortens the diffusion distances, and results in sufficient diffusion activities to promote synthesis reactions in every discrete grain of $WO_3$ which is produced by in-situ thermal decomposition of the ammonium tungstate. This allows the use of a broad range of particle sizes for the solid reactants which makes the process quite forgiving.

To illustrate this, $CuWO_4+0.958\ WO_3$ composite oxides (15% Cu) were synthesized from mechanical blends of spray-dried AMT and $Cu_2O$. Three feedstocks (A, B, C) for hydrogen reduction were synthesized having a nearly 2 to 1 variation in the median AMT particle size and a nearly 15 to 1 variation in the median $Cu_2O$ particle size. Concomitant with the size variation, there was a corresponding substantial variation of the surface area of solid reactants. The surface areas and particle sizes (90th, 50th, and 10th percentiles as determined by Microtrac) are given in Table 4.

sponding ratios established for the $CuWO_4+0.958\ WO_3$ composite in Tables 2 and 3. Thus, the phase distribution and homogeneity of W—Cu composite oxides is consistent within large ranges of reactant particle sizes. W—Cu composite oxides having median particle sizes from about 5 μm to about 25 μm may be produced from mechanical blends of ammonium tungstates having median particle sizes from about 5 μm to about 100 μm and oxides/hydroxides of copper having median particle sizes of about 0.5 μm to about 20 μm.

II. HYDROGEN REDUCTION OF COMPOSITE OXIDES

Co-reduced W—Cu composite powders made from the above W—Cu composite oxide mixtures, $CuWO_4+nWO_3$ (n>0), exhibit the gray color which is characteristic of the color of freshly reduced tungsten powder. No indication of the presence of copper is observed. This is consistent with the formation of W—Cu pseudoalloy particles wherein the copper phase has been substantially encapsulated by the tungsten phase.

The reduction of $CuWO_4$ begins with the reduction of copper followed by stepwise reduction of tungsten:

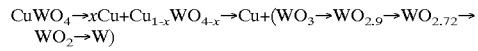

$$CuWO_4 \rightarrow xCu+Cu_{1-x}WO_{4-x} \rightarrow Cu+(WO_3 \rightarrow WO_{2.9} \rightarrow WO_{2.72} \rightarrow WO_2 \rightarrow W)$$

The reduction of copper from $CuWO_4$ has a very high thermodynamic probability and can be completed in the temperature range of 305° C. to 488° C.

Substantially higher temperatures are required for tungsten reduction from $WO_3$. For example, it is standard practice to reduce $WO_3$ in the temperature range of 840° C. to 900° C. In case of $CuWO_4$, the presence of copper lowers the $WO_3$ reduction temperature. For example, in the presence of copper, $WO_3$ may be reduced to tungsten via the stepwise reduction of tungsten suboxides between 661° C. to 750° C.

The discrepancy between temperatures needed to reduce copper from $CuWO_4$ (300° C. to 400° C.) and final stages of tungsten reduction (750° C. to 800° C.) is significant and results in segregation of prematurely reduced copper. Attempts to bring these temperatures closer by lowering the tungsten reduction temperatures may trigger another unde-

TABLE 4

SOLID-PHASE SYNTHESIS OF W-Cu COMPOSITE OXIDES (15% Cu) AT 775° C.

| | Tungsten Source (AMT) | | | | Copper Source ($Cu_2O$) | | | | Composite Oxide ($CuWO_4 + 0.958\ WO_3$) | | | |
|---|---|---|---|---|---|---|---|---|---|---|---|---|
| | Particle Size Distribution, μm | | | Specific Surface Area, | Particle Size Distribution, μm | | | Specific Surface Area, | Particle Size Distribution, μm | | | Specific Surface Area, |
| FEED-STOCK | D90 | D50 | D10 | $m^2/g$ | D90 | D50 | D10 | $m^2/g$ | D90 | D50 | D10 | $m^2/g$ |
| A | 61.4 | 28.3 | 5.3 | 0.34 | 29.9 | 14.5 | 4.7 | 0.18 | 29.0 | 15.8 | 5.7 | 0.38 |
| B | 40.5 | 16.4 | 4.5 | 0.49 | 29.9 | 14.5 | 4.7 | 0.18 | 25.8 | 13.2 | 5.5 | 0.41 |
| C | 40.5 | 16.4 | 4.5 | 0.49 | 6.2 | 1.0 | 0.2 | 2.80 | 27.7 | 14.3 | 6.5 | 0.42 |

Within the broad range of reactant particle sizes and surface areas, there is exhibited a strong trend toward equalization of these values in the synthesized composite oxide feedstocks. It is believed that the isomorphism between the starting AMT powders and the synthesized composite oxide powders is accountable for this equalization. The synthesized composite oxides were subjected to XRD phase analysis and EDS elemental analysis. The measured $WO_3/CuWO_4$ phase ratio and the W/Cu atomic ratio in all three feedstocks were equivalent to the corresirable effect. Stable, nonpyrophoric α-W is formed only by the stepwise suboxide reduction sequence at temperatures well above 500° C. to 550° C. Below these temperatures, a pyrophoric, unstable β-W, or a $W_3O$ phase, is formed as a result of skipping the suboxide sequence and going through a $WO_3 \rightarrow W_3O \rightarrow W$ transition. Thus, the catalytic effect caused by the presence of copper may promote the formation of pyrophoric β-W.

In order to circumvent copper segregation and the formation of pyrophoric β-W while achieving a homogeneous distribution of Cu and W phases in the co-reduced powder, it has been suggested to reduce $CuWO_4$ at once at rather high temperatures (about 700° C.). However, this would be difficult to implement under industrial hydrogen reduction conditions where boats containing the composite oxide material have to pass through a temperature transition zone before reaching the final isothermal zone where the reduction would occur.

It has been found that the $WO_3$-coated $CuWO_4$ particle phase distribution in the W—Cu composite oxides dramatically influences the reduction kinetics of copper from the composite oxide compared to its reduction from $CuWO_4$.

hydrogen with a dew point of −60° C. XRD, Optical Microscopy (OM) and Back-scattered Electron Imaging (BEI) were used to analyze the material at different stages in the reduction process. No phase transition could be detected by XRD, OM or BEI until the composite oxide was exposed to an average temperature of 542° C. across the boat length. An increase in surface area of the material and appearance of the $CuWO_{3.19}$ phase indicated the onset of copper reduction which was confirmed by OM. BEI photomicrographs showed the deposition of copper along the grain boundaries of oxides.

TABLE 5

HYDROGEN REDUCTION KINETICS OF THE $CuWO_4$ + 0.958 $WO_3$ (15% Cu)

| Boat Temperature, ° C.** | Phases Detected by XRD | Surface Area, $m^2/g$ | Degree of Reduction, % |
|---|---|---|---|
| 25 | $CuWO_4$, $WO_3$ | 0.38 | 0 |
| 542, Average | $CuWO_4$, $CuWO_{3.19}$, $WO_3$, Cu | 0.93 | 9.5 |
| 682, Average | $WO_{2.72}$, $WO_2$, Cu | 1.48 | 28.6 |
| 768, Average | $WO_2$, Cu, W | 1.54 | 47.6 |
| 800, After 21 Minutes | $WO_2$, Cu, W | 1.31 | 64.3 |
| 800, After 34 Minutes | $WO_2$, Cu, W | 0.92 | 85.7 |
| 800, After 48 Minutes | $WO_2$, Cu, W | 0.75 | 97.0 |
| 25 | Cu, W | 0.69 | 99.5 |

**Average Rate of Temperature Increase From 25° C. to 800° C. = 13° C./Minute; Residence Time at 800° C. = 60 Minutes Instead of the 300° C. to 400° C. temperature range, the appearance of copper is shifted to a much more favorable range of 550° C. to 700° C. This leaves less time for copper segregation prior to appearance of tungsten. Additionally, the catalytic effect of the presence of copper metal phase lowers the $WO_3$ reduction temperature to between 700° C. to 850° C. The copper particles formed during the reduction of the composite oxide serve as sites for deposition of tungsten thereby controlling the phase distribution and size of W—Cu composite powder. The encapsulation of the copper particles by tungsten prevents further segregation of the copper.

In the tests on hydrogen reduction of $CuWO_4+nWO_3$ (n>0) composite oxides, Inconel boats with composite oxide boatloads of 80 to 160 grams and bed depths of ⅜" to ¾" were used. Hydrogen flow rates may be from about 20 cm/sec to about 300 cm/sec. The tests were carried out in a laboratory tube furnace having thermal zones for gradual temperature increase, isothermal hold, and cooling down to ambient temperature. The reduction kinetics of the composite oxides was studied throughout the stages of temperature increase and isothermal hold of the reduction cycle. The rate of temperature increase from ambient temperature to the isothermal hold temperature varied within a broad range (5° C. to 20° C./minute) characteristic of rates used in industrial reduction furnaces. Reduction parameters—hydrogen flow rate and velocity, rate of temperature increase from ambient to isothermal hold, reduction temperature (isothermal hold), length of reduction—could be controlled for close simulation of the industrial reduction conditions. Table 5 illustrates the hydrogen reduction kinetics of the $CuWO_4+0.958\ WO_3$ composite oxide (Feedstock A, Table 4). The hydrogen reduction was performed using bed depths of ⅜" and dry At an average temperature of 682° C., the reduction of copper is close to completion. A honeycomb of copper deposited along the tungsten oxide grain boundaries was observed by OM. BEI clearly shows a submicron network of interconnected copper veins and a change in particle morphology from rounded to dendritic caused by the copper phase change and partial loss of oxygen. A $WO_{2.72}$ phase is observed by XRD showing that the reduction of $WO_3$ is proceeding via the $WO_3 \rightarrow WO_{2.9} \rightarrow WO_{2.72} \rightarrow WO_2 \rightarrow W$ sequence.

At an average temperature of 768° C., the material's surface area reaches its peak value probably because of the completion of the $WO_3 \rightarrow WO_2$ transition. XRD begins to detect the presence of tungsten. OM and BEI analysis find signs of both copper coalescence and tungsten deposition on copper.

The dominating processes throughout the 800° C. isothermal hold in the reduction cycle are: (1) a decrease in the material's surface area related to an increase in the degree of reduction; (2) the coalescence of copper; (3) $WO_2$ reduction and deposition of tungsten on copper surfaces leading to encapsulation of copper particles; and, (4) control of the size and morphology of the W—Cu composite particles by the size and morphology of the copper particles.

The resultant W—Cu composite powder consists of irregularly shaped particles having a phase distribution wherein the tungsten phase substantially encapulates the copper phase. Based on BEI and SNMS analyses, the thickness of tungsten coating varies with the size and shape of the composite particles and is estimated to range between 0.1 and 0.2 μm.

Copper plays an important role in controlling the size of the copper core and the overall size of the W—Cu composite particle. It was found that the particle size of as-reduced W—Cu composite powder increases with copper content and ranges from about 0.5 μm to about 2.0 μm (FSSS) as the copper content increases from 2 to 25 wt. %.

Table 6 shows the effect that reduction conditions have on the particle size of the W—Cu composite powders. $CuWO_4+0.958\ WO_3$ feedstocks A, B, and C (15% Cu) and a $CuWO_4+0.035\ WO_3$ feedstock D (25% Cu) were reduced under identical conditions (800° C. for 1 h. and 28 cm/sec $H_2$). The FSSS particle size ranged from 1.52 to 1.75 μm for the unmilled W—Cu composite powders having 15 wt. % Cu (W-15% Cu). The W—Cu composite powder having 25 wt. % Cu (W-25% Cu) had a slightly higher FSSS particle size of 1.8 μm. BEI analysis of the W-25% Cu powder shows larger, less interconnected particles compared to W-15% Cu powder.

Feedstock A was reduced at hydrogen flow velocities of 28 and 80 cm/second. A 2.86 times increase in hydrogen flow velocity from 28 to 80 cm/sec (800° C., 1 h.) caused a decrease in the FSSS particle size of the resultant W—Cu composite powder made from feedstock A from 1.75 μm to 0.96 μm. This is similar to the effect observed in the manufacture of tungsten powders.

Feedstocks A, B, C were reduced at two different temperatures, 800° C. and 750° C. The FSSS particle size of the reduced unmilled powder was decreased about 1.1 to about 1.4 times by a 50° C. decrease in reduction temperature. As a consequence of size reduction, the powder surface areas and, correspondingly, the oxygen content are increased. The reduced powders in Table 6 all had oxygen contents less than about 5000 ppm. For W—Cu composite powders reduced above about 850° C., excessive copper coagulation was observed. For powders reduced below about 700° C., the powders exhibited pyrophoricity because they were underreduced, had high surface areas, and had oxygen contents above 5000 ppm. Thus, it is preferable to reduce the W—Cu composite oxides between about 700° C. to about 850° C.

Composite metal powders consisting of two or more metal phases are more prone to oxidation and pyrophoricity than powders of a single metal. Passivation of the reduced W—Cu composite powders with nitrogen immediately after reduction dramatically decreases the powders tendency to oxidize and become pyrophoric. As an example, Feedstock A which was reduced at 700° C. using a hydrogen flow velocity of 80 cm/second had a submicron FSSS (0.74 μm), a high surface area and an oxygen content of 3200 ppm. After having been exposed to air for about 2 hours, the reduced powder became pyrophoric. When a similarly reduced powder was placed under nitrogen and passivated for about 2 hours, the reduced powder did not show any signs of pyrophoricity after 24 hours of exposure to air.

III. CONSOLIDATION OF W—Cu COMPOSITE POWDERS

The high surface area of the W—Cu composite powders increases the oxygen content in the powder compact. Surface oxides on the tungsten-copper interface present a significant problem in manufacturing a dense pseudoalloy with a continuous W—Cu structure. It has been established that at 1100–1200° C. oxygen-saturated copper does not wet tungsten. Oxygen-free copper also does not wet tungsten having surface oxides in the form of $WO_3$ or $[WO_2(OH)_2]$ on tungsten-copper interface. Cleaning oxygen from W—Cu powder compacts presents a fundamental problem in manufacturing the pseudoalloys. This problem is complicated by the "hydrogen disease" of copper and a high tungsten affinity for oxygen.

The data in Table 7 illustrate the problem of "hydrogen disease" in copper.

TABLE 7

| Temperature, ° C. | 1065 | 1100 |
|---|---|---|
| Oxygen Form of Existence | $Cu + 3.5\%\ Cu_2O$ (eutectic) | $Cu + 0.54\ Cu_2O$ or less after hydrogen cleaning |
| Concentration, % | 0.39 | 0.06 or less |
| Effect | Swelling in hydrogen. NO wetting of tungsten. | No swelling in hydrogen. Good wetting of tungsten. |

Water molecules formed during hydrogen reduction of trapped oxygen cause swelling of copper and W—Cu compacts. The compacts must have 15 to 20% porosity to allow free escape of water molecules and good hydrogen cleaning of oxygen. However, this does not completely solve the problem. In the presence of water vapor, complex $[WO_2(OH)_2]$ molecules form on the surface of tungsten. Therefore, forcing oxygen out of the W—Cu system and maintaining a clean interface between the metal phases presents a complex metallurgical problem.

Critical applications in electrical/electronic engineering require W—Cu pseudoalloys with superior structural homo-

TABLE 6

HYDROGEN REDUCTION OF W-Cu OXIDE COMPOSITES

| W-Cu composite oxide | Reduction Parameters | | | Particle Size Distribution, μm | | | | | | | | Unmilled Surface Area, m²/g | $O_2$, ppm |
|---|---|---|---|---|---|---|---|---|---|---|---|---|---|
| | Temp., ° C. | Hydrogen Flow Velocity, cm/sec | Holding Time, hours | Unmilled | | | | Rod Milled | | | | | |
| | | | | D90 | D50 | D10 | FSSS | D90 | D50 | D10 | FSSS | | |
| A | 750 | 28 | 1.5 | 24.9 | 8.0 | 1.6 | 1.42 | 6.1 | 1.5 | 0.5 | 0.72 | 1.42 | 1400 |
| B | 750 | 28 | 1.5 | 28.8 | 9.2 | 1.9 | 1.27 | 6.5 | 1.5 | 0.5 | 0.75 | 1.30 | 1600 |
| C | 750 | 28 | 1.5 | 14.1 | 5.5 | 1.4 | 1.27 | 2.6 | 1.0 | 0.4 | 0.78 | 1.27 | 1600 |
| A | 800 | 28 | 1 | 28.80 | 10.60 | 3.00 | 1.75 | 5.40 | 2.10 | 0.6 | 1.15 | 0.69 | 820 |
| B | 800 | 28 | 1 | 28.47 | 10.41 | 3.09 | 1.70 | 7.08 | 1.97 | 0.6 | 1.02 | 0.71 | 790 |
| C | 800 | 28 | 1 | 15.60 | 6.40 | 2.40 | 1.52 | 3.90 | 1.80 | 0.6 | 1.18 | 0.72 | 800 |
| A | 800 | 80 | 1.0 | 29.0 | 10.2 | 2.8 | 0.96 | — | — | — | — | 0.89 | 1300 |
| A | 750 | 80 | 1.5 | 27.1 | 7.1 | 1.5 | 0.85 | — | — | — | — | 1.68 | 1800 |
| A | 700 | 80 | 2.0 | 25.8 | 9.1 | 3.0 | 0.74 | — | — | — | — | 3.65 | 3200 |
| D | 800 | 28 | 1 | 31.5 | 12.6 | 2.9 | 1.80 | 7.5 | 2.6 | 0.8 | 1.25 | 0.56 | 1300 | geneity and performance under increased thermal and mechanical stresses. For metals, one of the most fundamental physical properties is the electrical conductivity. It can provide information on chemical composition, structural uniformity, electrical and mechanical properties, and material response to temperature changes. Of particular interest for W—Cu pseudoalloys is the excellent correlation between their electrical and thermal conductivity. The latter property is of critical importance in developing thermal management materials for electronics and is difficult to measure.

Modern methods of measuring electrical conductivity are based on nondestructive eddy current (EC) measurement principles. The electrical conductivities of the W—Cu pseudoalloys produced from the W—Cu composite powders were measured using an EC conductivity meter Type Sigmatest D 2.068 manufactured by the Institut Dr. Förster in Germany. Electrical conductivity measurements were made according to the International Accepted Conductivity Standard (IACS) issued by International Electronical Commission in 1914 for high conductivity copper as 100% IACS.

Sintering activity is the basic property which controls powder consolidation. To eliminate complicating factors, sintering activity should be tested using deagglomerated powders having finite particle dimensions. From Table 6, it can be seen that the average median particle size of deagglomerated (rod-milled) W-15% Cu composite powders reduced at 800° C. from feed-stocks A, B and C is about 2 μm. These rod-milled powders were sintered to produce W—Cu pseudoalloy articles. Consolidation may be carried out in hydrogen, dissociated ammonia or vacuum.

About 0.5 wt. % of an organic lubricant (Acrawax) was blended with the W—Cu composite powder to impart pressability. Acrawax C is the trade name for ethylene bis-stearamide manufactured by Lonza Co.,Fair Lawn, N.J. This white organic lubricant powder decomposes between 300 to 400° C. without leaving any harmful residue in the compact. Round samples (D×H=14.8 mm×3 to 4 mm) were die-pressed to a green density of between about 40 to about 75% of theoretical density (TD) by applying a compacting pressure in the range of 18.8 to 206.8 ksi. Powder compacts were sintered under flowing dry hydrogen in a molybdenum tube inside a high temperature laboratory furnace having automated control of the heating cycle. The sintering cycle consisted of a combination of temperature increases and isothermal holds. A temperature rate increase of 10° C./min was used between 120 minute isothermal holds at 850, 950, 1050, 1100, 1150, 1200, and 1250° C.

No appreciable linear shrinkage of the compacts was observed through 950° C. Above this temperature and through the final sintering temperature, the compacts experienced varying rates of shrinkage. Table 8 gives the shrinkage of the compacts as a function of sintering temperature and compacting pressure.

TABLE 8

Shrinkage of Compacts from W-15% Cu Composite Powder (D50 = 2 μm)

| Compacting Pressure, | Linear shrinkage, %, vs. Sintering Temperature, ° C. | | | | | Ratios of Incremental to Total Shrinkage (×100, %) | |
|---|---|---|---|---|---|---|---|
| ksi | 1050 | 1100 | 1150 | 1200 | 1250 | 1050/1250 | 1100/1250 |
| 18.8 | 5.00 | 18.35 | 21.01 | 22.05 | 22.23 | 22.49 | 82.55 |
| 37.6 | 5.23 | 16.85 | 18.88 | 19.73 | 19.82 | 26.39 | 85.02 |
| 56.4 | 4.68 | 15.23 | 17.49 | 17.73 | 17.92 | 26.12 | 84.99 |
| 75.2 | 4.48 | 14.09 | 16.11 | 16.12 | 16.36 | 27.38 | 86.12 |
| 94.0 | 4.19 | 12.93 | 14.69 | 15.03 | 15.23 | 27.51 | 84.90 |
| 112.8 | 3.94 | 12.52 | 13.66 | 13.96 | 14.12 | 27.90 | 88.67 |
| 131.6 | 3.50 | 11.37 | 12.67 | 12.81 | 13.15 | 26.62 | 86.46 |
| 150.4 | 3.64 | 10.43 | 11.68 | 11.82 | 12.08 | 30.13 | 86.34 |
| 169.2 | 3.48 | 9.88 | 10.84 | 10.90 | 11.34 | 30.69 | 87.13 |
| 188.0 | 3.20 | 8.76 | 10.02 | 10.30 | 10.57 | 30.27 | 82.88 |
| 206.8 | 3.04 | 8.31 | 9.48 | 9.71 | 9.91 | 30.68 | 83.85 |

In each sintering run, the total shrinkage progressively decreased with increasing compacting pressure and green density. However, the incremental shrinkage of compacts exhibited an opposite trend: ratios of incremental shrinkage to total shrinkage at 1250° C. were progressively higher with the increase in compacting pressure and better W—W contacts. The incremental shrinkage of samples exhibited values of up to 88.67% in the temperature interval of 950–1100° C. Appearance of liquid copper at 1100° C. could not be considered as the only factor responsible for such high rates of shrinkage since this temperature is quite low for sintering W—Cu systems. Therefore, such high sintering rates could only be attributed to rapid local densification of submicron tungsten particles at the stage of solid-state sintering. Such densification rates should adversely affect the sintering process and result in an unevenly sintered tungsten framework. In turn, this should cause uneven densification and copper bleedout at the liquid-phase sintering stage. Indeed, this has been observed at a sintering temperature of 1250° C.

Figure 7:
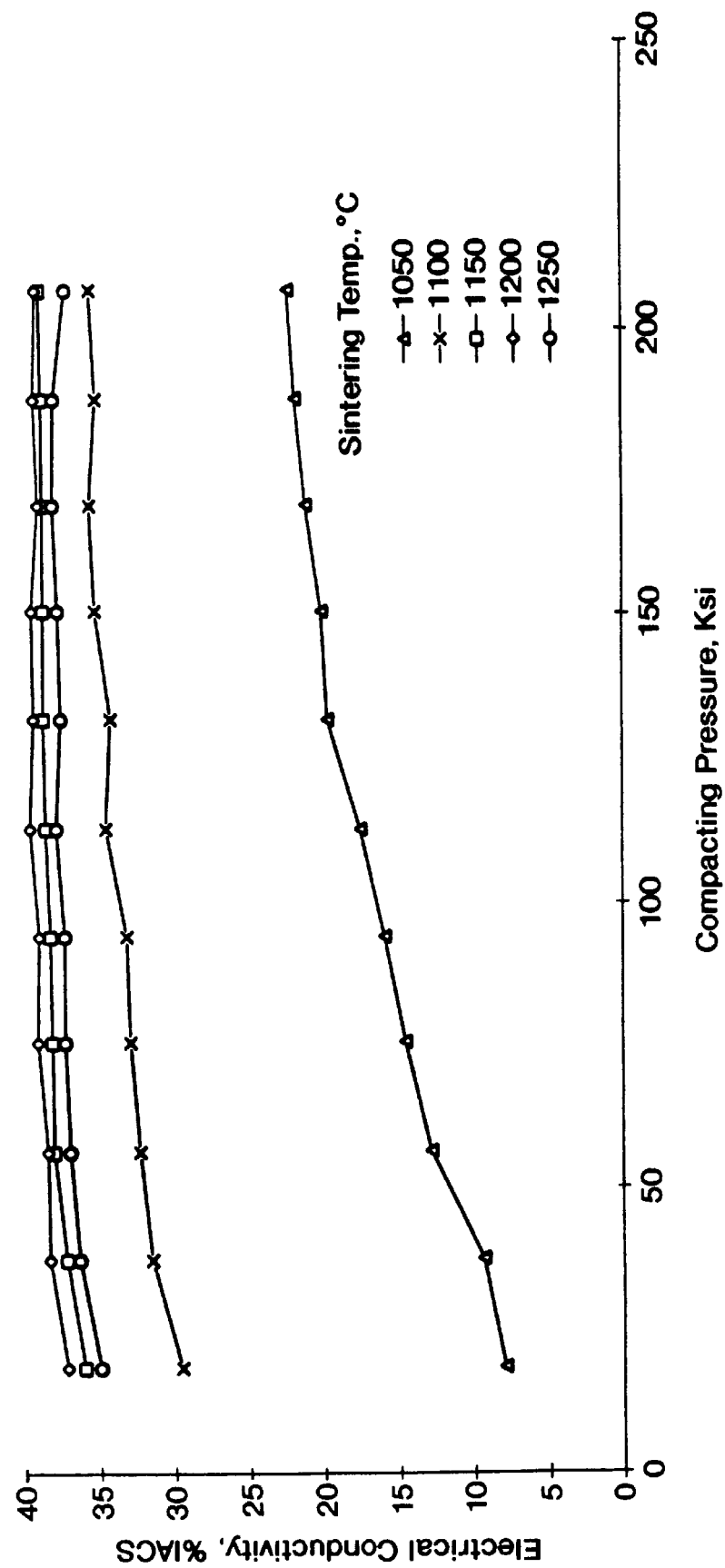
FIG. 7 is a graphical representation of the relationship between the compacting pressure and the electrical conductivity at different sintering temperatures for a W—Cu pseudoalloy made from a tungsten-coated copper composite powder having 15 weight percent copper.

Referring to the pressing-sintering curves in FIG. 7, a growth of electrical conductivity can be observed with the increase in liquid-phase sintering temperature and shrinkage of the samples. However, despite the continued shrinkage at 1250° C., there is a drop in electrical conductivity of samples sintered at this temperature. It is accompanied by appearance of copper areas at the sample surfaces. Since sintered densities of 98–98.5% TD have been reached at this temperature, the bleedout of copper could only be attributed to nonuniform densification, in particular, to high rates of shrinkage and structurally inhomogeneous tungsten framework formed at the stage of solid-state sintering.

The complete elimination of copper bleedout at high sintered densities is achieved by reducing the rate of temperature increase during the solid-state sintering stage. A preferred sintering method for the tungsten-coated copper composite powders includes the steps of: (1) lubricant or binder removal from the consolidated powder at 300–500° C.; (2) residual oxygen removal at 800–950° C.; (3) in situ sintering of a tungsten framework at very low rates of temperature increase (about 1° C./minute to about 5° C./minute)in the range of 950–1080° C.; (4) residual oxygen removal from molten copper at 1080–1130° C.; and (5) internal infiltration of the tungsten framework and densification of the pseudoalloy at 1150–1600° C.

The phase distribution in the composite powder particles (a submicron tungsten coating over a micron-size copper core) predetermines the very high densification activity at the liquid-phase sintering stage. Numerous sintering experiments verified that the densification temperature should be a function of the powder copper content as follows:

TABLE 9

| Copper Content, wt. % | Temperature, ° C. |
| --- | --- |
| 20–25 | 1150–1200 |
| 15–20 | 1200–1250 |
| 10–15 | 1250–1300 |
| 5–10 | 1300–1350 |
| 2–5 | 1350–1600 |

Tungsten-copper composite oxides synthesized from spray-dried AMT and $Cu_2O$ and having a relative copper content in the range of 5 to 25 wt. % Cu were reduced in a laboratory hydrogen reduction furnace at 800° C. using a hydrogen flow velocity of 28 cm/sec. The co-reduced W—Cu composite powders had the following typical characteristics:

D50 Unmilled—6.4–12.6 μm

D50 Rod-Milled—1.8–2.6 μm

BET—0.55–0.75 $m^2/g$ $O_2$—800–1300 ppm

The as-reduced powders without prior deagglomeration were pressed into round samples as above. The sintering cycle consisted of one hour duration isothermal holds at 450, 850, 950, 1100° C. and one of the alloy densification temperatures based on its copper content (Table 10):

TABLE 10

| Copper Content, wt. % | Temperature, ° C. |
| --- | --- |
| 25 | 1200 |
| 20 | 1250 |
| 15 | 1300 |
| 10 | 1350 |
| 5 | 1400 |

The rate of temperature increase between isothermal holds was 4° C./min. Between 950 to 1080° C., the rate of temperature increase was limited to 1° C./min. After completion of densification, the parts were cooled down to room temperature at a rate of 4° C./min.

The tests with systematic control of copper content and sintering temperature confirmed that coreduced W—Cu composite powders possess a high sintering activity even without prior deagglomeration. No copper bleedout was observed. High sintered densities were achieved for W—Cu pseudoalloys with 10 to 25 wt. % of copper. The amount of liquid phase was, apparently, inadequate for achieving a high sintered density in the W-5 wt. % Cu alloy.

Figure 8:
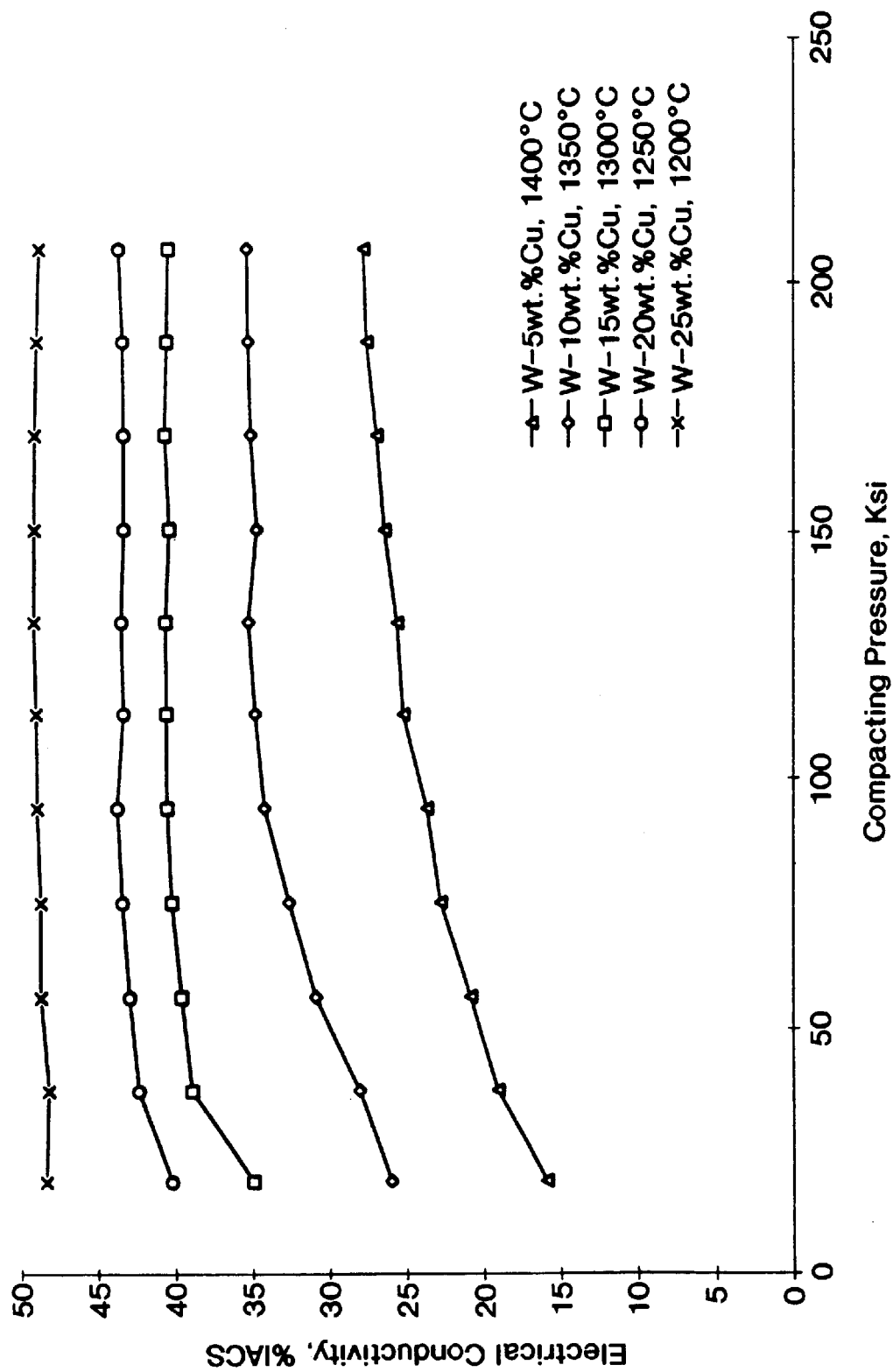
FIG. 8 is a graphical representation of the relationship between the compacting pressure and the electrical conductivity of W—Cu pseudoalloys made from tungsten-coated copper composite powders containing varying amounts of copper.

FIG. 8 shows the electrical conductivities for these samples as a function of compacting pressure. Due to insufficient copper content, the electrical conductivity in the W-5 wt. % Cu pseudoalloy keeps increasing with the compacting pressure within the whole range of tested pressures. For the W-10 wt. % Cu samples, the stabilization of electrical conductivity coincides with the stabilization of sintered density and occurs at a compacting pressure of about 110–115 ksi. Progressively lower compacting pressures are needed for stabilization of electrical conductivity and sintered density for pseudoalloys with higher copper content. They are, correspondingly, 75–80 ksi for W-15 wt. % Cu, 55–60 ksi for W-20 wt. % Cu, and 40–50 ksi for W-25 wt. % Cu.

Table 11 summarizes the analyses of the microstructural characteristics of the W—Cu pseudoalloy samples. BEI photomicrographs showing the microstructural cross-sections of the W—Cu pseudoalloys show uniformly distributed and densely packed tungsten areas having sizes less than about 5 μm and copper areas having sizes less than about 10 μm.

Somewhat large sintered tungsten areas and isolated copper areas are characteristic of the W-5 wt. % Cu system. The phase distribution uniformity and interconnection greatly improves upon increasing the copper content to 10 wt. % and, especially, to 15 wt. %. However, higher copper contents result in developing scattered copper areas. Still, the tungsten and copper phases remain fully interconnected. The size of tungsten areas in the photomicrographs progressively decreases with the amount of copper from below 5 μm at 5 wt. % Cu to below 1 μm at 25 wt. % Cu.

A similar analysis of a W—Cu pseudoalloy formed by infiltrating a sintered tungsten skeleton with copper showed a much coarser microstructure. Analysis of the microstructural cross-section showed that the average size of the tungsten areas was 10 to 15 μm and the size of the copper areas was 15 to 25 μm. Thus, the W—Cu pseudoalloys formed by pressing and sintering the tungsten-coated copper composite powders have much finer microstructures than infiltrated W—Cu pseudoalloys. Furthermore, W—Cu pseudoalloys having a copper content less than 10 wt. % cannot be successfully made by infiltration techniques.

TABLE 11

Microstructural Characteristics of the W-Cu Pseudoalloys

| Copper Content, wt. % | Structural Uniformity | Tungsten Network | | Copper Network | |
| --- | --- | --- | --- | --- | --- |
| | | Size of areas, μm | Shape | State | Size of areas, μm |
| 5 | Large sintered W areas; isolated Cu areas | ≦5 | Angular | Isolated within W network boundaries | 5–10 |
| 10 | Some sintered W areas; uniform distribution of Cu | ≦3 | Angular | Some interconnected/mostly isolated within W network boundaries | ≦5 |
| 15 | Uniform distribution of phases | ≦2 | Mostly Rounded | Interconnected with some clusters of W areas | ≦2 |
| 20 | Mostly uniform; several large Cu areas | ≦2 | Rounded | Highly interconnected with few multiple W areas | ≦5 |

TABLE 11-continued

Microstructural Characteristics of the W-Cu Pseudoalloys

| Copper Content, wt. % | Structural Uniformity | Tungsten Network | | Copper Network | |
|---|---|---|---|---|---|
| | | Size of areas, μm | Shape | State | Size of areas, μm |
| 25 | Uniform; scattered Cu areas of various sizes | ≦1 | Rounded | Totally interconnected | ≦5 |
| 15** | Highly uniform distribution of phases | ≦1 | Rounded; very uniform | Highly interconnected with no isolated W areas | ≦2 |

**W-Cu composite powder was milled and spray dried prior to sintering

Table 12 compares the electrical conductivities of W—Cu pseudoalloys made by sintering the co-reduced W—Cu composite powders with pseudoalloys made by pressing, sintering, and infiltrating a tungsten skeleton with copper. Appreciably higher electrical conductivities, and therefore higher thermal conductivities, are achieved in W—Cu pseudoalloys made from the W—Cu composite powders having W-coated copper particles.

TABLE 12

| Copper Content In Pseudoalloy, % | | Electrical Conductivity, % IACS of Pseudoalloy Made: | | |
|---|---|---|---|---|
| By Weight | By Volume | From Composite Powder | By Cu Infiltration of a Tungsten Skeleton | Conductivity Ratio |
| 5 | 10.2 | 27.6 | — | — |
| 10 | 19.3 | 36.9 | 35.0 | 1.054 |
| 15 | 27.5 | 41.2 | — | — |
| 20 | 35.0 | 44.2 | 41.0 | 1.078 |
| 25 | 42.0 | 48.9 | 45.0 | 1.086 |

Spray-dried, lubricated, flowable powders which can be formed into various complex shapes are considered an ideal powder source for manufacturing technologies involving pressing, molding, rolling, and extrusion. As a rule, powders are subjected to deagglomeration (milling) prior to spray drying which significantly improves their uniformity.

Samples of a $CuWO_4+0.958\ WO_3$ composite oxide (15% Cu) synthesized from spray-dried AMT and $Cu_2O$ were reduced in a D-muffle furnace at 800° C. (Type 1) and in a tube furnace at 750° C. (Type 2) under industrial conditions. The co-reduced W—Cu composite powders were milled for 30 minutes in a water slurry using Type 440C stainless steel balls as milling media. Carbowax-8000, a high molecular weight polyethylene glycol manufactured by Union Carbide Corporation, was used as a binder. The Carbowax-8000 was added to the slurry to give a 2.5 wt. % binder concentration in the spray-dried powder. Spray drying yielded a spherical powder having excellent flowability and pressability and a 90% −60 +200 mesh fraction. Rectangular (16×18×5 mm) samples weighing 20 g each were pressed at 70 ksi from both types of spray-dried powder. The compacts were subjected to the preferred sintering method described previously. Table 13 gives the average test results for pseudoalloys made from Types 1 and 2. No adverse effects on sintering properties were observed at the carbon concentrations remaining in the compacts after dewaxing. Good sintered density, electrical conductivity, and complete elimination of any signs of copper bleedout were achieved in the sintered samples. A representative sample microstructure is characterized in Table 11 and shown in FIG. 9.

Figure 9:
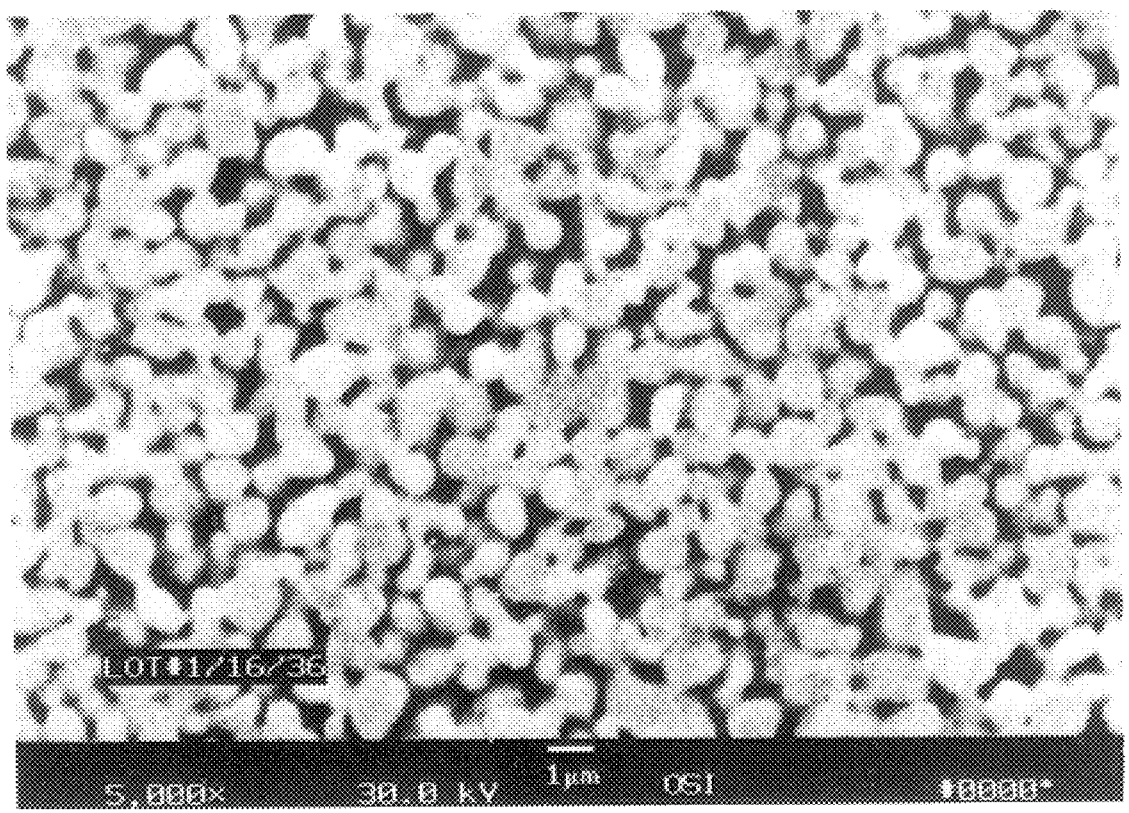
FIG. 9 is a photomicrograph of a cross-section of a W—Cu pseudoalloy having 15 wt. % Cu which was made from a milled and spray dried tungsten-coated copper composite powder.

FIG. 9 is a BEI photomicrograph of a W—Cu pseudoalloy made from a milled and spray dried tungsten-coated copper composite powder having 15 wt. % Cu which was sintered at 1250° C. to 98.2% of theoretical density. The tungsten areas in the microstructural cross-section appear white and the copper areas appear dark. The photomicrograph clearly shows the uniform distribution of the tungsten and copper areas as well as the highly interconnected structure of the pseudoalloy.

TABLE 13

| | Powder Properties | | | | Compact Properties | | |
|---|---|---|---|---|---|---|---|
| | | | | | Carbon Content | Sintered | Electrical |
| Type No. | FSSS, μm | BET, m²/g | $O_2$, ppm | Sintering Temp., ° C. | After Dewaxing, ppm | Density, % TD | Conductivity, % IACS |
| 1 | 1.22 | 0.80 | 1100 | 1300 | 190 | 98.66 | 40.00 |
| 2 | 1.27 | 1.91 | 3160 | 1250 | 333 | 98.17 | 40.86 |

IV. CERAMIC METALLIZATION

Ceramic metallization is one of the most critical and precision operations in electronics. It consists of forming a metal layer on ceramic surfaces with a ceramic-to-metal joint which is both strong and vacuum-tight. Metallized ceramic surfaces are used for ceramic-to-metal and ceramic-to-ceramic connections and for wiring conductor layers (paths) in electronic technology. Metallized ceramic is produced by applying a metallizing paste to sintered or unsintered ceramic substrates (mostly alumina or beryllia) and firing the paste to yield an adherent metallized area. Co-firing a paste with the "green" (unsintered) ceramic is economically advantageous since it eliminates presintering the ceramic and results in better quality metallization. A number of paste formulations and metallization techniques have been disclosed in U.S. Pat. Nos. 3,620,799, 4,493,789 and 4,799,958.

Generally, a paste for ceramic metallization consists of three basic components: metal powder, frit material, and a binder. For low-temperature metallization (up to 1200–1250° C.) of presintered ceramics metals like silver, palladium, nickel and copper may be used. High-temperature metallization or co-firing with an unsintered ceramic (up to 1600–1700° C.) requires the use of refractory metals (W, Mo) alone, or their mixtures with Mn or Pt. Frit material comprises oxides and silicates. Due to their glassy nature, frit components are filling the pores in the ceramic substrate and metal structure and help making a vacuum tight ceramic-to-metal joint. Metal powders and frit materials are held together by binders like ethyl cellulose, nitrocellulose, epoxy resins, and many other organic binding agents. Usually, the components are milled and mixed for several hours to decrease their particle size and make a homogeneous blend. Finally, the consistency of the metallizing paste is adjusted by a vehicle which is actually a solvent compatible with the binder. For instance, for ethyl cellulose binders, ethylene glycol dibutyl ether is preferred. Consistency adjustment is required according to the method of application of the paste on ceramic surfaces. Screen printing technique is usually employed for ceramic wiring boards and packages; other methods like painting, spraying, dipping, etc. are also broadly applied.

Refractory metals require high temperatures for metallization. The electroconductivity of the tungsten conductor layer is increased in proportion to the sintering temperature. Higher electrical conductivity makes it possible to sinter finer wires (paths or lines) and increase the packaging density of the wiring boards. However, metallizing temperatures above 1750° C. are very detrimental to the ceramic. Even at temperatures between 1450 and 1700° C. the ceramic exhibits grain growth which may be detrimental to its strength, and hot creep to the point where creepage is a severe problem.

All three objectives—(1) lowering the co-firing temperature for metallizing an unsintered ceramic; (2) increasing the electrical conductivity of the metallized wires; and (3) improving the packaging density of wiring boards—can be accomplished by using the tungsten-coated copper composite powder in the metallizing paste formulations.

The W-5 wt. % Cu powder can be sintered at temperatures as low as 1400° C. to high densities and electrical conductivities. However, copper content in the range of 2 to 15 wt. % can be used for broadening the range of metallizing temperatures to 1200–1600° C. By controlling the copper content in the W—Cu composite powder used in pastes, the electrical conductivity of the metallized conductive lines can be controlled. Moreover, due to excellent structural homogeneity of W—Cu pseudoalloys from the W-coated copper composite powders, the width of the metallized conductive line can be decreased thereby improving the packaging density of a semiconductor assembly. Indeed, 0.002 inch line widths have been successfully metallized using the W-15 wt. % Cu powder.

While there has been shown and described what are at the present considered the preferred embodiments of the invention, it will be obvious to those skilled in the art that various changes and modifications may be made therein without departing from the scope of the invention as defined by the appended claims.

We claim:

1. A method for forming a homogeneous W—Cu pseudoalloy comprising pressing a tungsten-coated copper composite powder to form a compact and sintering the compact, the tungsten-coated copper composite powder comprising individual particles having a tungsten phase and a copper phase wherein the tungsten phase substantially encapsulates the copper phase.

2. The method of claim 1 wherein sintering the compact comprises forming a sintered tungsten framework in a solid-state sintering stage followed by internal infiltration of the sintered tungsten framework by liquid copper during a liquid-phase sintering stage.

3. The method of claim 1 wherein the compact is sintered without copper bleedout.

4. The method of claim 3 wherein the sintering comprises subjecting the compact to a temperature cycle, the temperature cycle comprising (1) increasing temperature from ambient temperature to a temperature sufficient to cause solid-state sintering, (2) slowly increasing the temperature at a rate of about 1° C./minute to about 5° C./minute until liquid-phase sintering begins, and (3) increasing the temperature to a temperature sufficient to complete densification of the compact.

5. The method of claim 4 wherein the temperature sufficient to complete densification is from 1150° C. to 1600° C.

6. The method of claim 5 wherein the temperature sufficient to complete densification is determined by the amount of copper in the tungsten-coated copper composite powder.

7. The method of claim 1 wherein the tungsten-coated composite W—Cu powder is mixed with a binder prior to pressing.

8. The method of claim 1 wherein sintering the compact comprises (1) removing a binder from the compact at 300–500° C.; (2) oxygen removal from the compact at 800–950° C.; (3) solid-state sintering of a tungsten framework at a very low rate of temperature increase in the range of 950–1080° C.; (4) oxygen removal from molten copper at 1080–1130° C.; and (5) internal infiltration of the tungsten framework and densification of the pseudoalloy at 1150–1600° C.

9. The method of claim 8 wherein the rate of temperature increase during the solid-state sintering is from about 1° C./minute to about 5° C./minute.

* * * * *